US005409889A

United States Patent [19]

Das

[11] Patent Number: 5,409,889

[45] Date of Patent: Apr. 25, 1995

[54] FERROELECTRIC HIGH TC SUPERCONDUCTOR RF PHASE SHIFTER

[76] Inventor: Satyendranath Das, 5415 Connecticut Ave. NW., #132, Washington, D.C. 20015

[21] Appl. No.: 61,762

[22] Filed: May 3, 1993

[51] Int. Cl.[6] .......................... H01P 1/18; H01P 9/00; H03H 11/16; H01B 12/02

[52] U.S. Cl. .................................... 505/210; 505/700; 505/701; 505/866; 333/161; 333/99.005

[58] Field of Search .................... 333/995, 161; 505/1, 505/700, 701, 866, 202, 204, 210

[56] References Cited

U.S. PATENT DOCUMENTS 5,032,805 7/1991 Elmer et al. .................... 333/161 X
5,208,213 5/1993 Ruby ................................ 333/18 X
5,212,463 5/1993 Babbitt et al. ....................... 333/161

OTHER PUBLICATIONS

Das, S. N.; "Ferroelectric for Time Delay Steering of an Array"; *Ferroelectrics;* 1973, vol. 5; pp. 253-257.
Jackson, C. M., et al; Novel Monolithic Phase Shifter Combining Ferroelectrics and High Tc Superconductors; *Microwave and Optical Tech Letters;* vol. 5, No. 14, 20 Dec. 1992; pp. 722-728.

*Primary Examiner*—Benny T. Lee

[57] ABSTRACT

The Ferroelectric high Tc superconductor RF Phase Shifter contains a ferroelectric medium and a film of a single crystal high Tc superconductor is used as the conductors. Between the ferroelectric medium and the input, there is a quarter-wave, dielectric or ferroelectric or the same material as used for the phase shifter, matching transformer. Between the ferroelectric medium and the output, there is a quarter-wave, dielectric, ferroelectric or the same material as used for the phase shifter, matching transformer. A bias field is connected across the top and bottom surfaces of the active ferroelectric medium. When a bias field is applied across the surfaces of the ferroelectric medium, the permittivity is reduced and as such the velocity of propagation is increased. This causes an increase in the effective electrical length of the phase shifter or a phase difference or time delay. Increasing the bias voltage increases the phase shift. The ferroelectric high temperature superconductor RF phase shifter may be embedded as a part of the monolithic integrated circuit. The ferroelectric high Tc superconductor RF phase shifter may be constructed of thin film and ferroelectric liquid crystal. The ferroelectric material is operated above its Curie temperature.

10 Claims, 2 Drawing Sheets

FERROELECTRIC HIGH TC SUPERCONDUCTOR RF PHASE SHIFTER

FIELD OF THE INVENTION

The present invention relates to phase shifters for electromagnetic waves and more particularly, to RF phase shifters which can be controlled electronically.

DESCRIPTION OF THE PRIOR ART

In many fields of electronics, it is often necessary to change the phase of the signal. Commercial semiconductor and ferrite type phase shifters are available.

Ferroelectric materials have a number of attractive properties. Ferroelectrics can handle high peak power. The average power handling capacity is governed by the dielectric loss of the material. They have low switching time (such as 100 nS). Some ferroelectrics have low losses. The permittivity of ferroelectrics is generally large, as such the device is small in size. The ferroelectrics are operated in the paraelectric phase, i.e. slightly above the Curie temperature. The active part of the ferroelectric high Tc superconductor phase shifter can be made of thin films, and can be integrated with other monolithic microwave/RF devices. Inherently, they have a broad bandwidth. They have no low frequency limitation as in the case of ferrite devices. The high frequency operation is governed by the relaxation frequency, such as 95 GHz for strontium titanate, of the ferroelectric material. The loss of the ferroelectric high Tc superconductor RF phase shifter is low with ferroelectric materials with a low loss tangent. A number of ferroelectric materials are not subject to burnout.

Das discussed the application of microstrip line ferroelectric, with quarter wave matching dielectric transformers, phase shifters to a two element phased array. S. Das, "Ferroelectrics for Time Delay Steering of an array, " Ferroelectrics, vol. 5, pp. 253–257, 1973. A cavity type phase shifter has been discussed by Jackson et al, C. M. Jackson, J. H. Kobayashi, D. Durand and A. H. Silver, "A High Temperature Superconductor Phase Shifters," Microwave Journal, pp. 72–78, December 1992.

The U.S. Pat. No. 5,032,805 claims an electronically controlled RF phase shifter having an active medium formed from a ceramic material the permittivity of which may be varied by varying the strength of an electric field in which it is immersed. The phase shifter may be placed in an RF transmission line that includes appropriate input and output, impedance matching devices such as quarter-wave transformers.

The U.S. Pat. No. 5,032,805 does not include (1) the use of a deposition of superconductor material for lowering the conductive losses, (2) thin film devices, (3) ferroelectric materials other than ceramic materials, (4) use of ferroelectric liquid crystal, and (5) inclusion in monolithic microwave integrated circuits (MMIC).

The article by Jackson et al does not include (1) the same or other ferroelectric material as a matching device, (2) the use of ferroelectric liquid crystals. The article mentions a cavity type device which is (1) narrowband and (2) not a true time delay device. This invention discusses (1) the use of a transmission line real time delay device and (2) inherently broadband devices the actual bandwidth depends on the broadband nature of the matching devices.

There are two deficiencies of the current technology. The insertion loss is high as discussed by Das. The present invention uses low loss ferroelectrics discussed by Rytz et, al, D. Rytz, M. B. Klein, B. Bobbs, M. Matloubian and H. Fetterman, "Dielectric Properties of $KTa_{1-x}Nb_xO_3$ at millimeter wavelengths," Jap. J. Appl. Phys. vol. 24 (1985), Supp. 24-2, pp. 1010–1012, and to reduce the conductor losses, uses a high Tc, currently 77 to 105 degrees K., superconductor material as conductors. The properties of ferroelectrics are temperature dependent as discussed by Rytz et, al. This invent,ion uses the phase shifters at, the constant high Tc temperature.

Depending on trade-off studies in individual cases, the best type of phase shifter can be selected.

SUMMARY OF THE INVENTION

The general purpose of this invention is to provide an electronically controlled variable phase shifter which embraces the advantages of similarly employed conventional devices such as ferrite and semiconductor phase shifters. This invention, in addition, reduces the conductive losses.

To attain this, the present, invent,ion contemplates the use of a transmission line formed from a material whose permittivity is changed by changing an applied d.c. or a.c. electric field in which it is immersed. Upon the application of a bias voltage, the permittivity decreases resulting in a phase shift or a time delay shift.

It is an object of this invention to provide a voltage controlled ferroelectric phase shifter which uses lower control power and is capable of handling high peak and average powers than conventional phase shifter. Another object of the present invention is to provide a ferroelectric phase shifter which can be integrated into the structure of microwave and millimeter wave monolithic integrated circuits.

These and other objectives are achieved in accordance with the present invention which comprises of an RF transmission line having an input matching section, an active section and an output matching section. The active section is constructed from a solid or liquid ferroelectric material, such as $KTa_{1-x}Nb_xO_3$ (KTN), the permittivity of which changes with the changes in the applied bias electric field. This change in the permittivity produces a time delay or phase shift. By selecting an appropriate percentage of elements in KTN, the Curie temperature of the ferroelectric material can be brought slightly lower than the high Tc of a superconducting material. A high Tc superconductor material is used for conductive depositions.

With these and other objectives in view, as will hereinafter more fully appear, and which will be more particularly pointed out in the appended claims, reference is now made to the following description taken in connection with accompanying drawings.

DESCRIPTION OF THE PREFERRED EMBODIMENT

Figure 1:
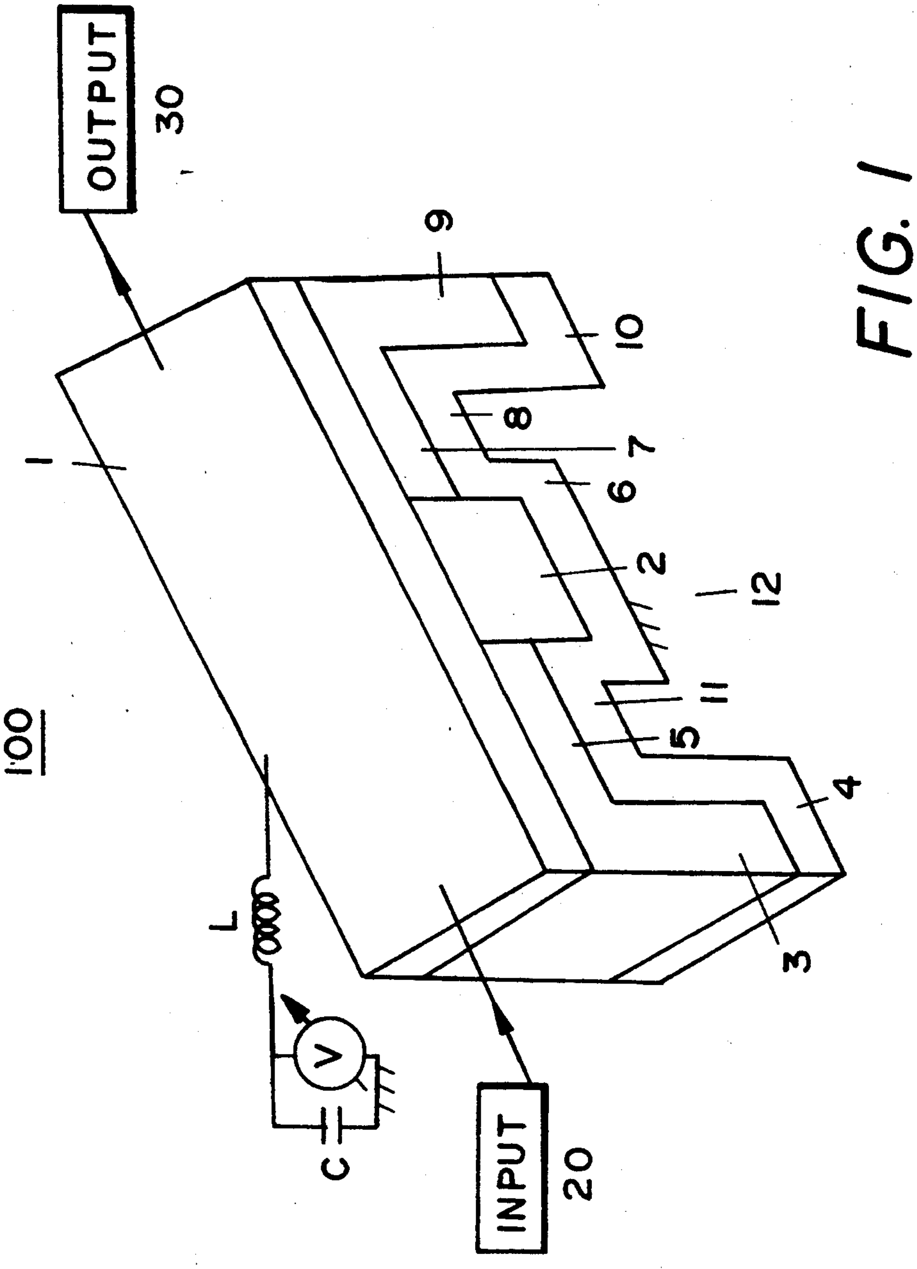
FIG. 1 is a pictorial, schematic diagram of a typical embodiment.

Referring now to the drawings, there is illustrated in FIG. 1 a typical microwave or millimeter wave circuit configuration that incorporates the principles of the present invention. Circuit 100 includes an RF input 20, an RF transmission line 12 and an RF output 30.

The circuit 100 might be part of a cellular, terrestrial, microwave, satellite, radio determination, radio navigation or other telecommunication system. The RF input may represent a signal generator which launches a telecommunication signal onto a transmission line 12 fop transmission and an output 30.

The phase shifter is made of the ferroelectric material 2 with a superconductor material deposition on the top surface 1. The bottom surface 6 is deposited with a superconductor material.

Figure 2:
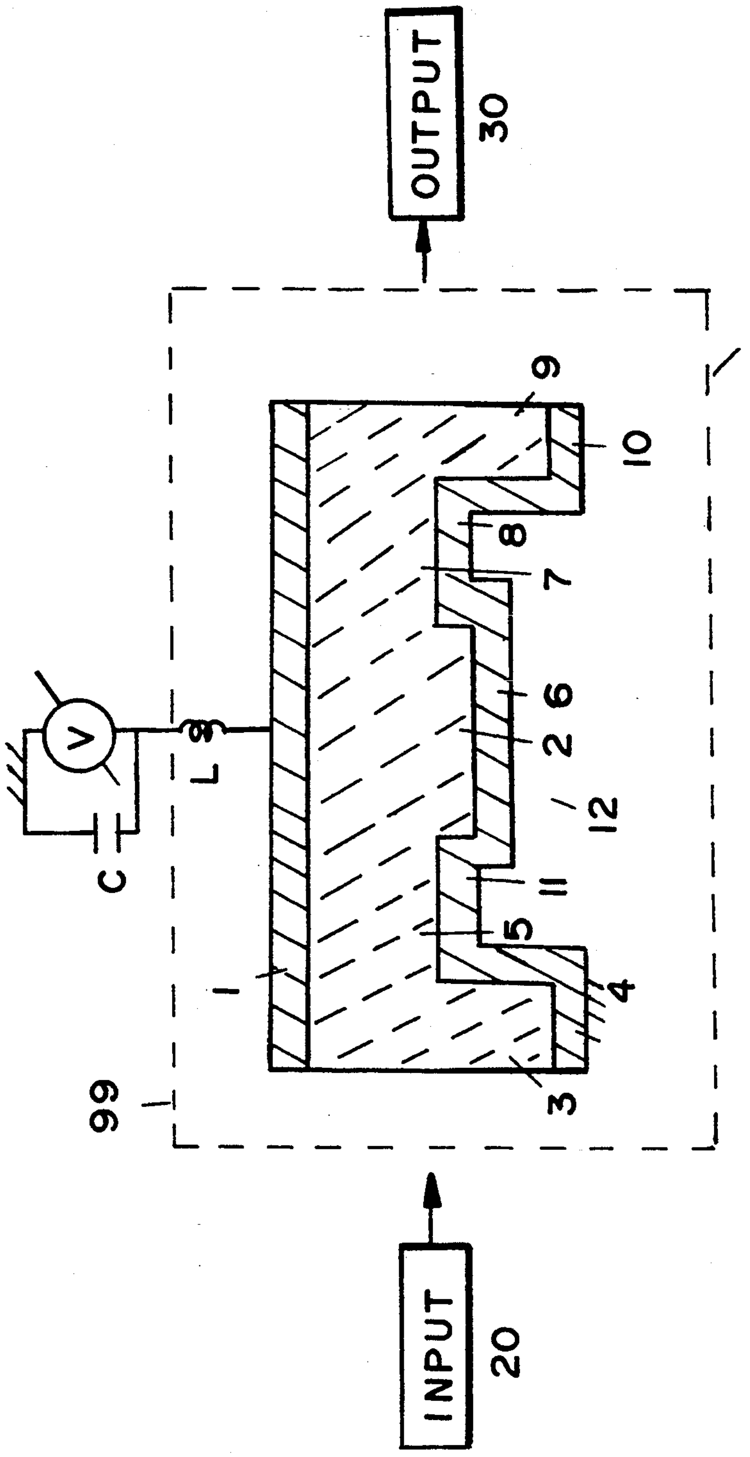
FIG. 2 is a schematic longitudinal section of a typical embodiment.

In addition to the phase shifter 2, the transmission line 12 contains one or more sections of quarter-wave length matching transformers of a ferroelectric or dielectric material, to match the impedance of the phase shifter 2 with the RF input 20. FIG. 2 shows two sections 3 and 5 of quarter-wave length matching transformers of the same material as used by the phase shifter. The matching section(s) can be of different heights or can have different widths or a combination of both height and width. In FIG. 1 another ferroelectric material is used for the quarter-wave length matching section(s). The bottom surfaces 4 and 11 and the top surface 1 of the matching transformers are deposited with a high Tc superconductor material. Quarter-wave length matching section(s) made of a ferroelectric material provide a better match when a bias voltage is applied to the phase shifter.

The transmission line 12 also contains one or more sections of quarter-wave length matching transformers to match the impedance of the phase shifter 2 to the RF output 30. FIG. 2 shows two sections 7 and 9 of quarter-wave length transformers of the same material as used by the phase shifter. In FIG. 1 another ferroelectric material is used for the quarter-wave length matching sections. Quarter-wave length matching section(s) made of a ferroelectric material provide a better output match when a bias voltage is applied to the phase shifter. The bottom surfaces 8 and 10 and the top surface 1 of the quarter-wave length matching transformers 7 and 9 are deposited with a superconductive material. Element 99 is the means for keeping the phase shifter at the high superconducting Tc.

An adjustable voltage source V is connected across the conductive surfaces 1 and 6. The inductor L provides a high impedance path to the RF energy and the capacitor C provides a short circuit path to any RF energy remaining at the end of the inductor L.

The RF energy, fed at 20, is transmitted through the phase shifter 2 to the output 30. The transmission line 12 provides an insertion time delay or phase shift to the input RF energy. With the application of a bias voltage V to the phase shifter, the permittivity of the phase shifter decreases, this increases the velocity of propagation through the phase shifter 2 and increases the time delay or the phase shift. Thus a differential time delay or phase shift is obtained. Increasing the magnitude of the bias voltage, increases the differential time delay or phase shift.

In order to prevent undesired RF propagation modes and effects, the height and the width of the transmission line 12 is appropriately selected.

The active ferroelectric medium 2, the quarter-wave length matching transformers 3, 5, 7 and 9 could be in thin film configurations.

A microstrip line configuration is shown in FIG. 1 as a discrete device. However, the same drawing will depict the active portion of a ferroelectric high Tc superconductor phase shifter and it's quarter-wave length matching transformers in a monolithic microwave integrated circuit (MMIC) configuration as a part of a more comprehensive circuit. The conductive depositions are microstrip line conductors.

The ferroelectric phase shifter can also be configured in a waveguide structure.

It should be understood that the foregoing disclosure relates to only typical embodiments of the invention and that numerous modification or alternatives may be made therein, by those of ordinary skill without departing from the spirit and the scope of the invention as set forth in the appended claims.

What is claimed is:

1. A ferroelectric high Tc superconductor RF phase shifter having an electric field dependent permittivity, comprising of:

a body of a solid ferroelectric material characterized by said permittivity and conductors disposed on top and bottom surfaces thereof;

a first RF transmission means containing a transformer comprising a ferroelectric material for coupling RF energy into the said body;

a second RF transmission means containing a transformer comprising a ferroelectric material for coupling RF energy from the said body;

a respective film of a single crystal high Tc superconductor material defining each one of said conductors;

means, coupled to said conductors, for applying an electric field to the phase shifter to reduce the permittivity of said ferroelectric material and thus to obtain a differential phase shift; and means, associated with said phase shifter , for keeping the phase shifter at the high superconducting Tc slightly above the Curie temperature of the ferroelectric material.

2. A ferroelectric high Tc superconductor phase shifter of claim 1 wherein said ferroelectric materials comprise ferroelectric liquid crystals (FLC).

3. A ferroelectric high Tc superconductor monolithic RF phase shifter, having an electric field dependent permittivity, comprising of;

a main microstrip line section disposed on a first film of a first ferroelectric material characterized by said permittivity;

a first microstrip line section disposed on a second film of a ferroelectric material having two transformers, each transformer being quarter-wave length long, at an operating frequency of the phase shifter, for impedance matching an input of the RF phase shifter to the first ferroelectric material;

a second microstrip line section disposed on a third film of a ferroelectric material having two transformers, each transformer being quarter-wave length long, at the operating frequency of the phase shifter, for matching the impedance of the first ferroelectric material to an output of the RF phase shifter;

said main, first and second microstrip line sections are disposed and connected together such that said first, second and third ferroelectric films are comprised of a common film;

a film of a single crystal high Tc superconductor material defining said main, first and second microstrip line sections;

means, coupled to said conductors, for applying an electric field to the phase shifter to reduce the permittivity of the said ferroelectric films and thus to obtain a differential phase shift; and means, associated with said phase shifter, for keeping the phase shifter at the high superconducting Tc slightly above the Curie temperature of the ferroelectric material.

4. A ferroelectric high Tc superconductor monolithic RF phase shifter of claim 3 wherein the third and the second films having respective heights which are different from a height associated with the first film.

5. A ferroelectric high Tc superconductor monolithic RF phase shifter of claim 3, wherein the phase shifter is a MMIC.

6. A ferroelectric high Tc superconductor monolithic RF phase shifter of claim 3 wherein the third and the second films having respective heights which are higher than a height associated with the first film.

7. A ferroelectric high Tc superconductor RF phase shifter of claim 6 wherein the monolithic phase shifter is a MMIC.

8. A ferroelectric high Tc superconductor monolithic RF phase shifter of claim 6;

the third and the second films having respective heights which are different from a height associated with the first film; and the phase shifter being a MMIC.

9. A ferroelectric high Tc superconductor RF phase shifter, having an electric field dependent permittivity, comprising of;

a main microstrip line section disposed on a first ferroelectric material characterized by said permittivity;

a first microstrip line section disposed on a ferroelectric material having two transformers, each transformer being quarter-wave length long, at an operating frequency of the phase shifter, for impedance matching an input of the RF phase shifter to the first ferroelectric material;

a second microstrip line section disposed on a ferroelectric material having two transformers, each transformer being quarter-wave length long, at the operating frequency of the phase shifter, for matching the impedance of the first ferroelectric material to an output of the RF phase shifter;

a film of a single crystal high Tc superconductor material defining said main, first and second microstrip line sections;

said main, first and second microstrip line sections are connected together and are disposed on a common ferroelectric material; and means, associated with said phase shifter, for keeping the phase shifter at the high superconducting Tc slightly above the Curie temperature of the ferroelectric material.

10. A ferroelectric high Tc superconductor RF phase shifter of claim 9 wherein the ferroelectric material of the first and the second microstrip line sections having respective heights which are different than a height associated with the main microstrip line section ferroelectric material.

* * * * *